United States Patent
Knierim et al.

(10) Patent No.: US 9,194,888 B2
(45) Date of Patent: Nov. 24, 2015

(54) AUTOMATIC PROBE GROUND CONNECTION CHECKING TECHNIQUES

(71) Applicant: Tektronix, Inc., Beaverton, OR (US)

(72) Inventors: Daniel G. Knierim, Beaverton, OR (US); William A. Hagerup, Portland, OR (US); Barton T. Hickman, Portland, OR (US); Ira G. Pollock, Hillsboro, OR (US)

(73) Assignee: TEKTRONIX, INC., Beaverton, OR (US)

( * ) Notice: Subject to any disclaimer, the term of this patent is extended or adjusted under 35 U.S.C. 154(b) by 188 days.

(21) Appl. No.: 13/649,303

(22) Filed: Oct. 11, 2012

(65) Prior Publication Data

US 2014/0103951 A1    Apr. 17, 2014

(51) Int. Cl.
G01R 31/04 (2006.01)
G01R 1/067 (2006.01)
G06F 19/00 (2011.01)
G01R 31/02 (2006.01)

(52) U.S. Cl.
CPC ........ *G01R 1/06788* (2013.01); *G01R 1/06766* (2013.01); *G01R 31/026* (2013.01)

(58) Field of Classification Search
CPC .................................................... G01R 31/026
See application file for complete search history.

(56) References Cited

U.S. PATENT DOCUMENTS

| | | | |
|---|---|---|---|
| 6,064,312 A | 5/2000 | Weller | |
| 6,351,112 B1 | 2/2002 | Felps et al. | |
| 6,725,170 B1 | 4/2004 | Hickman | |
| 6,856,129 B2* | 2/2005 | Thomas et al. | 324/754.07 |
| 7,167,011 B2* | 1/2007 | Yang | 324/754.07 |
| 7,408,363 B2 | 8/2008 | Tan et al. | |
| 7,414,411 B2 | 8/2008 | Tan et al. | |
| 7,460,983 B2 | 12/2008 | Pickerd et al. | |
| 8,410,804 B1* | 4/2013 | Goeke | 324/754.01 |
| 2004/0196021 A1* | 10/2004 | McTigue | 324/72.5 |
| 2007/0041512 A1* | 2/2007 | Pickerd et al. | 379/30 |
| 2009/0206859 A1 | 8/2009 | Swaim et al. | |

FOREIGN PATENT DOCUMENTS

| | | |
|---|---|---|
| EP | 1688750 A1 | 8/2006 |
| JP | H08160097 A | 6/1996 |
| WO | 03058260 A1 | 7/2003 |

OTHER PUBLICATIONS

European Search Report and Written Opinion for European Patent Application No. 13 18 8180, issued Jan. 31, 2014, 8 pages.

* cited by examiner

*Primary Examiner* — Jermele M Hollington
(74) *Attorney, Agent, or Firm* — Marger Johnson; William K. Bucher

(57) ABSTRACT

A test system can include a probe suitable to be coupled between a test measurement device and a device under test (DUT). The probe can include a signal input to receive an active signal from the DUT and a signal output to provide the active signal to the test measurement device. The probe can also include an input ground to connect to the DUT ground and an output ground to connect to the test measurement device ground. A probe ground connection checking device can automatically determine whether the probe ground connections to the DUT ground and test measurement device ground are solid.

7 Claims, 7 Drawing Sheets

AUTOMATIC PROBE GROUND CONNECTION CHECKING TECHNIQUES

BACKGROUND OF THE INVENTION

The connection between an oscilloscope probe and a device under test (DUT) is often unreliable due to motion of the probe, e.g., if held by hand, motion of the DUT, e.g., vibration or thermal expansion, or both. The presence of a faulty connection for the "active" lead, e.g., signal lead of a probe to the DUT, is usually easy to determine if the registered signal is dramatically different from the expected signal.

However, the presence of a faulty connection for the "cold" lead, e.g., ground lead of a probe or negative lead of a differential probe connected to the DUT ground, is much more difficult to determine. This is because there is usually a low-frequency ground connection between the oscilloscope and the DUT through grounding power cords, other probe channel grounds, etc., and sometimes a high-frequency connection through capacitive coupling across the faulty connection. Thus, only a band of frequencies is typically misrepresented in the acquired oscilloscope record, which often causes subtle errors that are easy to miss by a user.

Oscilloscope users have traditionally dealt with this unreliability by either wiggling the probe to see if anything changes in the signal or temporarily disconnecting the probe from the oscilloscope and measuring the resistance from the probe ground to the DUT ground with an ohmmeter.

While the "probe wiggling" approach is generally quick and intuitive, this approach is rather heuristic in nature and often causes a good connection to become bad. While the "temporary disconnecting" approach indeed checks the probe ground to DUT ground connection, this approach requires manual intervention and also adds wear to the probe connector.

SUMMARY OF THE INVENTION

Embodiments of the disclosed technology generally include an automated probe-to-DUT (device under test) connection verification that can be easily initiated through an oscilloscope user interface, e.g., by way of a button on the probe or oscilloscope front-panel, a menu entry, a remote command over a general purpose interface bus (GPIB) or local area network (LAN), automatically, or any combination thereof.

DETAILED DESCRIPTION

Embodiments of the disclosed technology generally include various techniques for automatically checking a ground connection between an oscilloscope and a device under test (DUT), e.g., within a probe and/or probe cable. These and other features and embodiments of the present invention proceed with reference to each of the figures.

Figure 1:
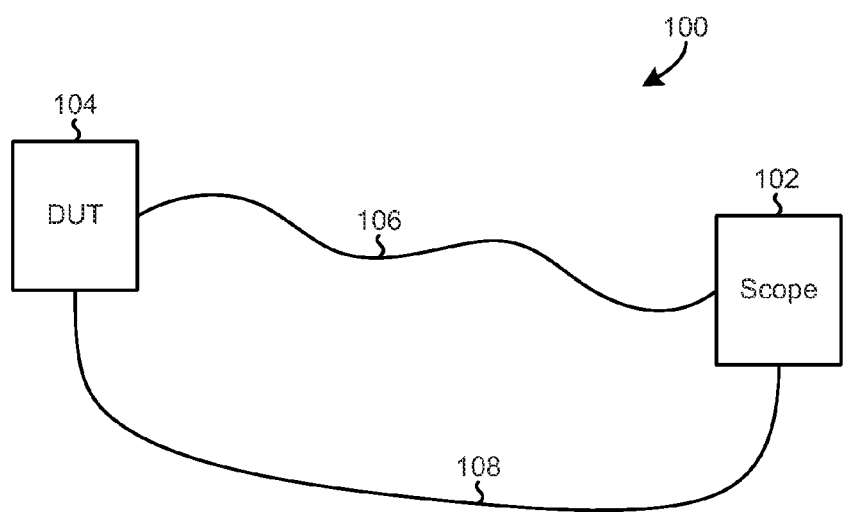
FIG. 1 illustrates an example of a testing system in accordance with certain embodiments of the disclosed technology.

FIG. 1 illustrates an example of a testing system 100 in accordance with certain embodiments of the disclosed technology. The testing system 100 includes an oscilloscope 102, a DUT 104, and a ground connection 106 between the oscilloscope 102 and the DUT 104. The ground connection 106 is usually established by way of a probe and corresponding probe cable and/or other suitable connecting mechanism.

The testing system 100 also includes an auxiliary ground 108 that exists due to indirect physical connections between the oscilloscope 102 and the DUT 104, such as power-cord ground connections, ground connections of other probes, a table or other supporting structure, floor, etc. In certain systems, however, the auxiliary ground 108 is not present.

Figure 2:
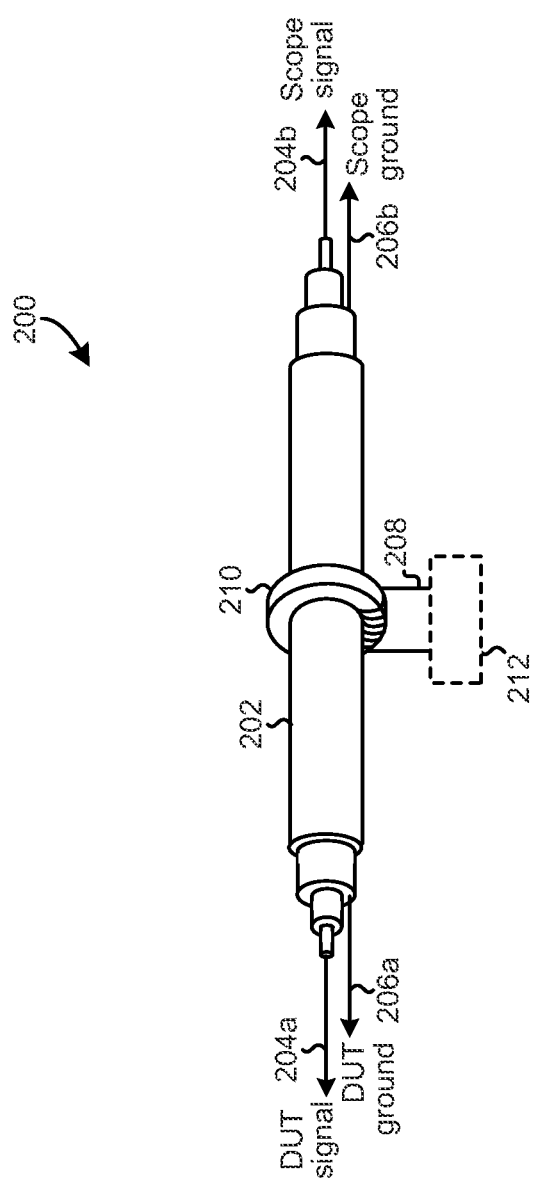
FIG. 2 illustrates an example of a first technique for checking a ground connection between an oscilloscope and a DUT, such as the oscilloscope and DUT of FIG. 1, in accordance with certain embodiments of the disclosed technology.

FIG. 2 illustrates an example of a first technique 200 for checking a ground connection between an oscilloscope and a DUT, such as the oscilloscope 102 and the DUT 104 of FIG. 1, in accordance with certain embodiments of the disclosed technology. The example includes a probe or probe cable 202, such as a coaxial cable, that has a signal input 204a, e.g., to receive an active signal from the DUT, a signal output 204b, e.g., to provide the signal to the oscilloscope, an input ground 206a, e.g., to connect to the DUT ground, and an output ground 206b, e.g., to connect to the oscilloscope ground.

In the example, the first technique 200 includes the inductive coupling of a test coil 208 to the probe cable 202 by passing both through a magnetic core 210 and measuring the inductance of the test coil 208, e.g., by way of an optional impedance meter 212. This may be performed, for example, by injecting an alternating current therein and measuring the resulting voltage.

A solid probe-to-DUT ground connection, combined with another oscilloscope-to-DUT ground connection, e.g., power cords, may create a shorted loop through the magnetic core, thereby lowering the inductance of the test coil.

One having ordinary skill in the art will appreciate that the illustrated technique 200 is shown functionally and that the physical implementation thereof may be accomplished using any of a number of ways. For example, either or both of the test coil 208 and magnetic core 210 may be partially or fully integrated with the probe cable 202 or, alternatively, removably attachable thereto. Similarly, the optional impedance meter 212 or other suitable measurement device may be integrated with or separate from either or both of the test coil 208 and magnetic core 210.

The illustrated technique 200 provides a number of advantages. For example, the magnetic core 210, test coil 208, or combination thereof are generally easy to add to existing probe designs. Alternatively, the magnetic core 210, test coil 208, or combination thereof may be constructed as a separate accessory that may be used in connection with virtually any existing probe cable.

The illustrated technique 200 is also advantageous in that such implementations generally do not interfere with the signal-path design of a probe. Further, verification of the ground connection may be performed without affecting active signal acquisitions, at least in situations where the connection is solid.

Figure 3:
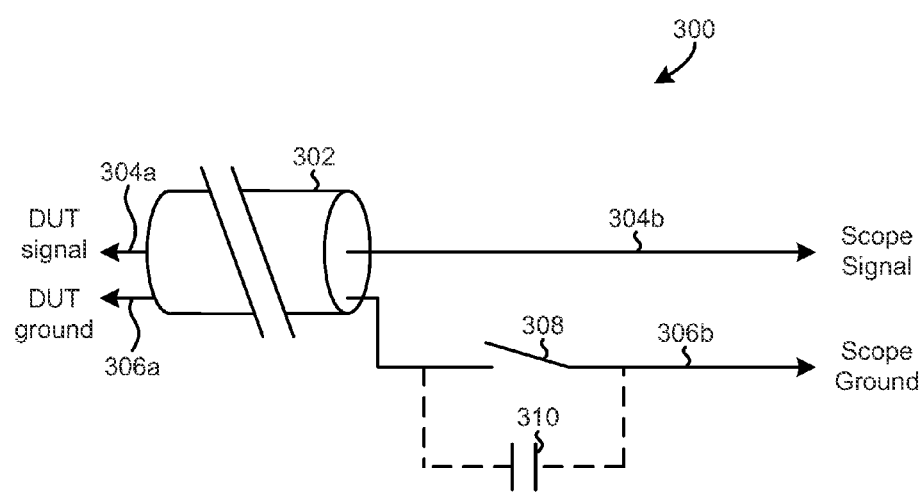
FIG. 3 illustrates an example of a second technique for checking a ground connection between an oscilloscope and a DUT, such as the oscilloscope and DUT of FIG. 1, in accordance with certain embodiments of the disclosed technology.

FIG. 3 illustrates an example of a second technique 300 for checking a ground connection between an oscilloscope and a DUT, such as the oscilloscope 102 and the DUT 104 of FIG. 1, in accordance with certain embodiments of the disclosed technology. The example includes a probe or probe cable 302 that has a signal input 304a, e.g., to receive an active signal from the DUT, a signal output 304b, e.g., to provide the signal to the oscilloscope, an input ground 306a, e.g., to connect to the DUT ground, and an output ground 306b, e.g., to connect to the oscilloscope ground.

In the example, the technique 300 includes separating the input ground 306a from the output ground 306b, e.g., by way of a switch mechanism 308, inserting a direct current into the input ground 306a, and checking for a low DC resistance return path, e.g., through the probe-to-DUT ground connection and oscilloscope-to-DUT ground connection. The determination of a low DC resistance return path may indicate that the ground path within the probe cable 302 is functioning as expected, whereas a high DC resistance return path may indicate the presence of a disconnect or other issue with the probe ground path.

In certain embodiments, the input ground 306a and output ground 306b may be AC coupled, e.g., by way of an optional capacitor 310, to allow for AC signal current flow during the check for a low DC resistance return path. Capacitor 310 may also be useful in reducing the high-frequency impedance of the probe ground path due to inductance and/or resistance in the switch mechanism 308.

Figure 4:
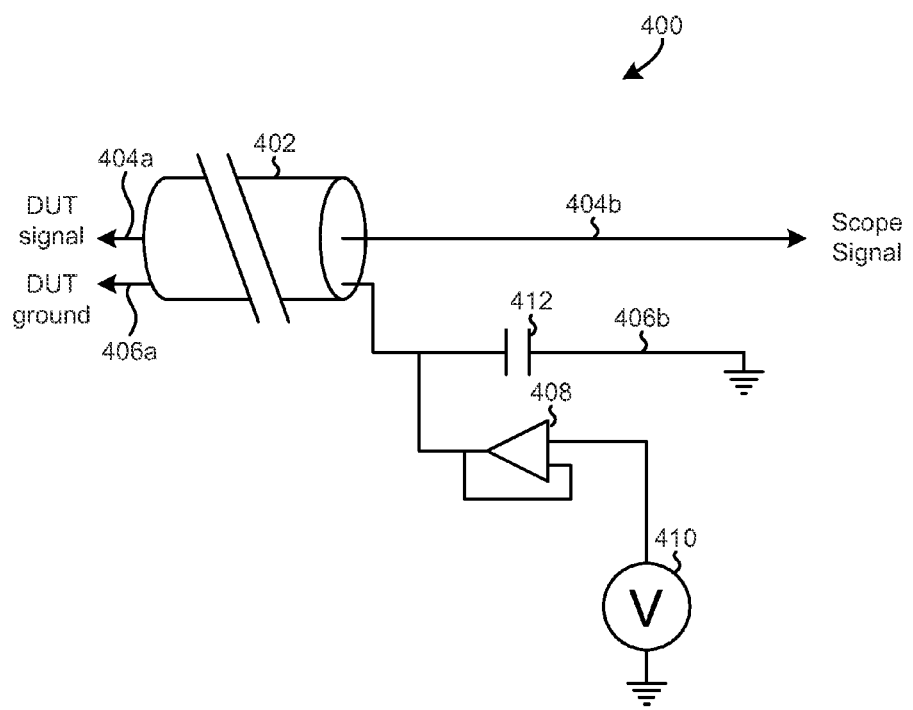
FIG. 4 illustrates an example of a third technique for checking a ground connection between an oscilloscope and a DUT, such as the oscilloscope and DUT of FIG. 1, in accordance with certain embodiments of the disclosed technology.

FIG. 4 illustrates an example of a third technique 400 for checking a ground connection between an oscilloscope and a DUT, such as the oscilloscope 102 and the DUT 104 of FIG. 1, in accordance with certain embodiments of the disclosed technology. This example is similar to the example illustrated in FIG. 3 in that it includes a probe or probe cable 402 that has a signal input 404a, e.g., to receive an active signal from the DUT, a signal output 404b, e.g., to provide the signal to the oscilloscope, an input ground 406a, e.g., to connect to the DUT ground, and an output ground 406b, e.g., to connect to the oscilloscope ground.

The example illustrated in FIG. 4 is different from the example illustrated in FIG. 3, however, in that the technique 400 includes a buffer amplifier 408 and voltage source 410, e.g., a DAC, between the input ground 406a and the output ground 406b rather than a switch mechanism separating the input ground 406a from the output ground 406b. Here, the voltage source 410 can be programmed to drive the input ground [through the buffer amplifier 408] to 0.0 V, e.g. ground, for normal operation or to some non-zero voltage to check for a low-impedance path back to the scope ground through the auxiliary path. That is, this technique can check for an output current-limit condition in the buffer amplifier 408 to determine a low-resistance path.

The example illustrated in FIG. 4 also includes a capacitor 412 in parallel with the buffer amplifier 408 and voltage source 410. By monitoring the behavior, e.g., current draw, of the buffer amplifier 408 and voltage source 410, a determination may be made as to whether there is a disconnect or other issue with regard to the ground path within the probe cable 402 or the connection to the DUT ground at 406a.

The techniques 300 and 400 of FIGS. 3 and 4, respectively, provide various advantages. For example, the physical implementations have the potential of being very small. Also, the implementations of these techniques generally do not interfere with typical probe signal-path designs. Further, probe ground path integrity verification can be typically performed without affecting active signal acquisitions, at least in situations where the connection is solid.

Figure 5:
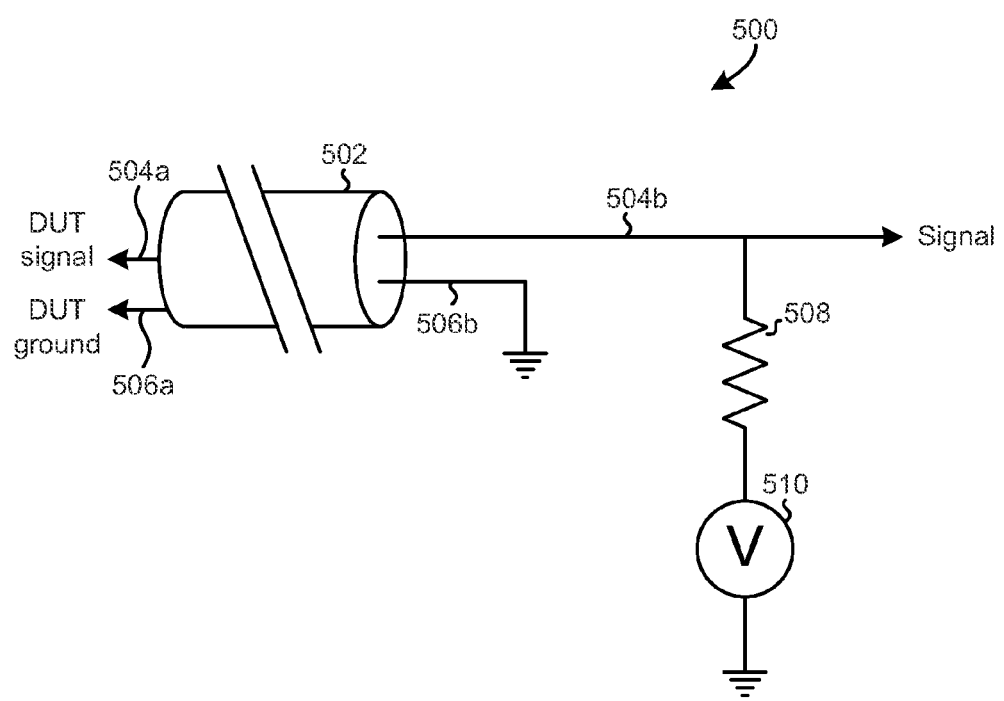
FIG. 5 illustrates an example of a fourth technique for checking a ground connection between an oscilloscope and a DUT in accordance with certain embodiments of the disclosed technology.

FIG. 5 illustrates an example of a fourth technique 500 for checking a connection between an oscilloscope probe and a DUT in accordance with certain embodiments of the disclosed technology. The example includes a probe or probe cable 502 that has a signal input 504a, e.g., to receive an active signal from the DUT, a signal output 504b, e.g., to provide the signal to the oscilloscope, an input ground 506a, e.g., to connect to the DUT ground, and an output ground 506b, e.g., to connect to the oscilloscope ground. In this example, however, there is no auxiliary ground connection so the technique involves checking the DUT signal and ground connections as well as the DUT drive impedance.

The example further includes a resistor 508 and a voltage source 510 such that the probe termination voltage may be adjusted. Once the voltage has been adjusted, a check may be made as to whether the calculated probe tip voltage stays relatively constant. A low-resistance drive generally indicates good connections, whereas a high-resistance drive generally indicates a bad connection, in which case the probe tip voltage may track the termination voltage.

In situations involving a differential or TriMode™ probe, each pertinent termination voltage may be adjusted. If the termination voltages of the differential or TriMode probe can be adjusted independently and/or the probe tip voltages measured independently, the two probe tip connections may be independently verified. Otherwise, a solid connection for both probe tips may still be simultaneously verified. Also, the differential probe tip signal connections can be verified with this technique independent of the absence or presence of an auxiliary ground connection.

Implementations of this technique 500 are particularly advantageous in that they can be fully implemented as software for many existing probe designs that provide adjustable termination voltages, so there is no need for additional probe hardware to perform the ground checking.

Figure 6:
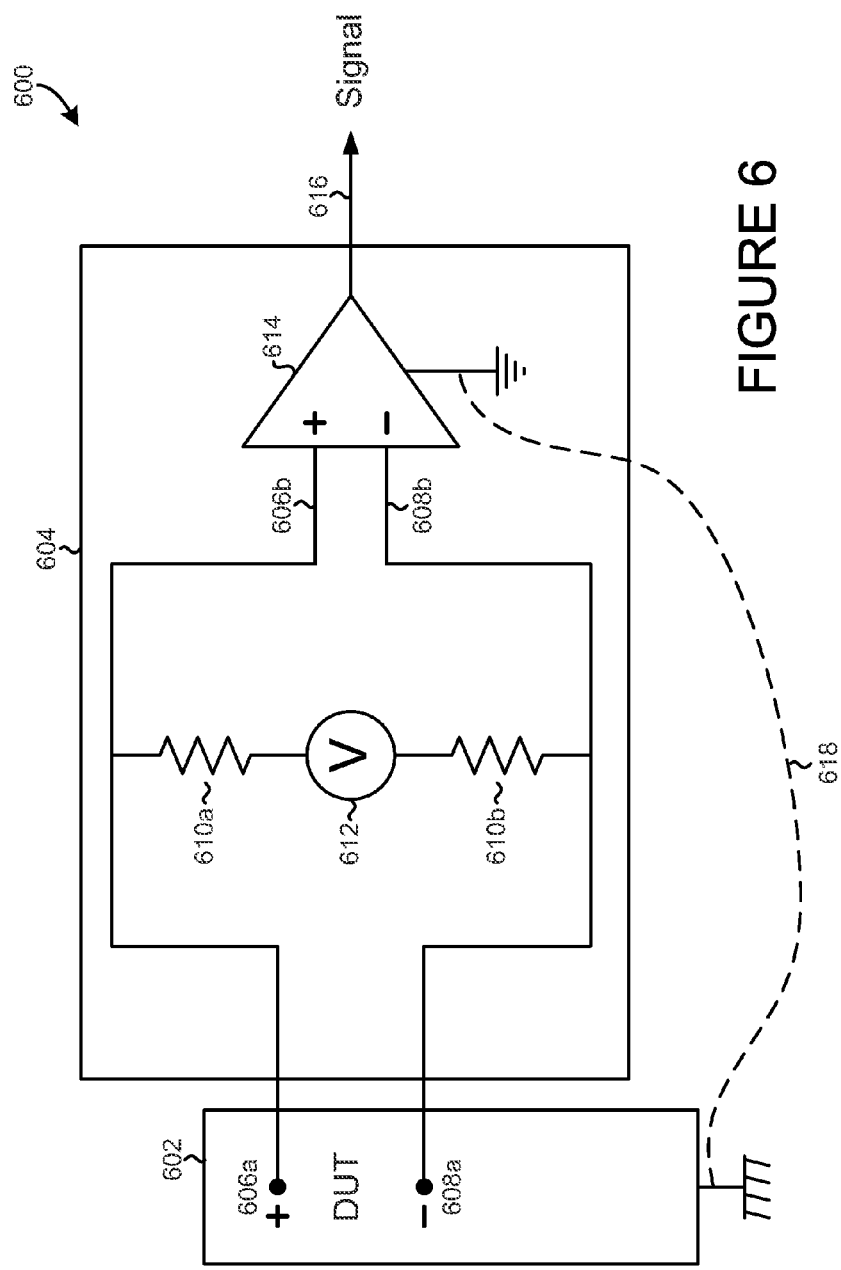
FIG. 6 illustrates an example of a fifth technique for checking a ground connection between an oscilloscope and a DUT in accordance with certain embodiments of the disclosed technology.

FIG. 6 illustrates an example of a fifth technique 600 for checking a connection between an oscilloscope probe and a DUT in accordance with certain embodiments of the disclosed technology. The example includes a probe or probe cable 604 configured to receive an input differential signal via DUT inputs 606a and 608a from DUT 602 and provide an output differential signal 616, e.g., to an oscilloscope.

In the example, the output differential signal 616 is generated by way of the input differential signal received from DUT inputs 606a and 608a being passed to internal circuitry 614 via internal inputs 606b and 608b. The probe 604 also includes resistors 610a and 610b and a voltage source 612 for adjusting the signal being passed to the internal circuitry 614 via the internal inputs 606b and 608b. This technique 600 is particularly advantageous in that it may be used to check for an intact differential connection, including differential ground path, regardless of whether an auxiliary ground connection 618 is present.

Figure 7:
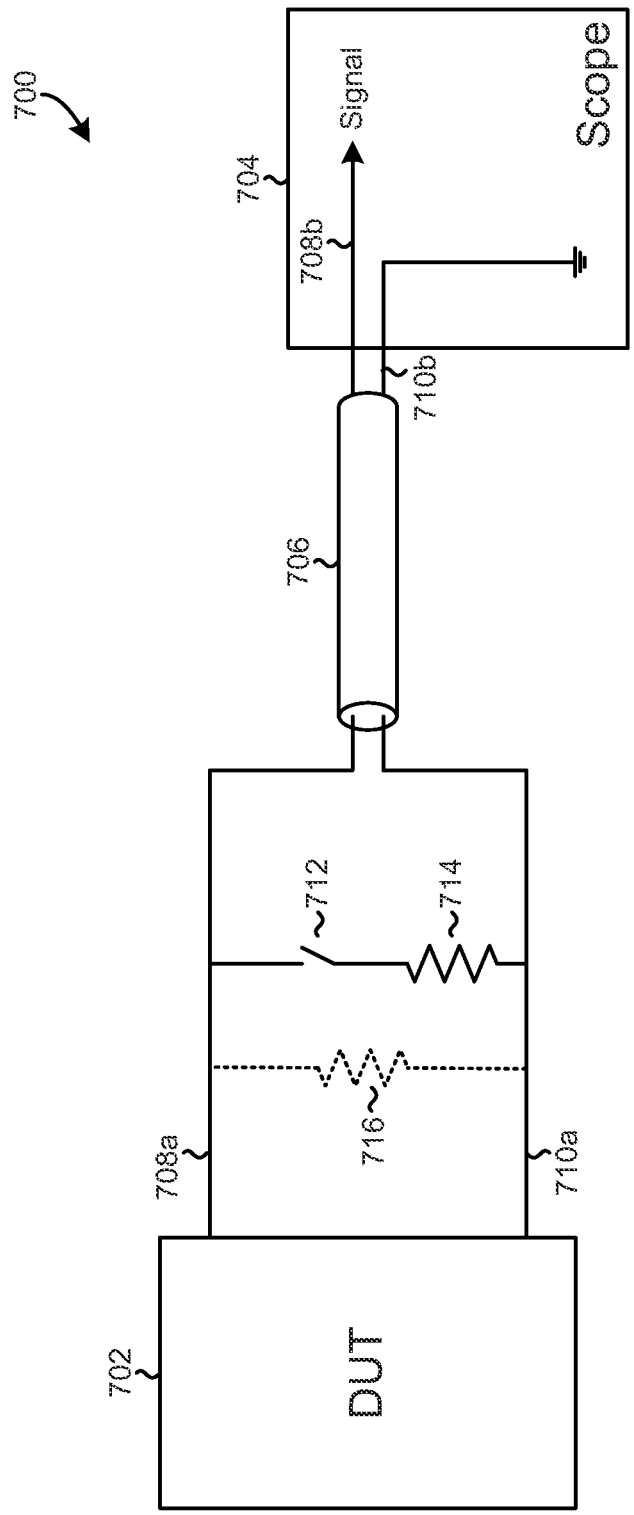
FIG. 7 illustrates an example of a sixth technique for checking a ground connection between an oscilloscope and a DUT, such as the oscilloscope and DUT of FIG. 1, in accordance with certain embodiments of the disclosed technology.

FIG. 7 illustrates an example of a sixth technique 700 for checking a ground connection between a DUT 702 and an oscilloscope 704 in accordance with certain embodiments of the disclosed technology. The example is similar to the example illustrated in FIG. 5 in that it includes a probe or probe cable 706, e.g., a de-embed probe, that has a signal input 708a, e.g., to receive an active signal from the DUT 702, a signal output 708b, e.g., to provide the signal to the oscilloscope 704, an input ground 710a, e.g., to connect to the ground of the DUT 702, and an output ground 710b, e.g., to connect to the ground of the oscilloscope 704.

In the example, a sub-assembly including a switching mechanism 712 and two impedance elements 714 and 716, where impedance element 716 represents the normal input impedance of the probe or probe cable 706, may be used to measure the source impedance driving the probe 706. The measured source impedance may then be compared with the expected source impedance, e.g., as determined by knowledge of the DUT 702. A substantially similar or identical match of the source impedance with the expected impedance generally indicates a good connection, whereas a mismatch generally indicates a disconnect or other issue with regard to the signal or ground connection between the DUT 702 and the probe or probe cable 706.

Implementations of this technique 700 are particularly advantageous in that, because they can be fully implemented as software, there is no need for additional probe hardware to perform the ground checking. Further, this technique 700 may be used to check both signal and ground lead connections, because a bad ground connection will generally be reflected in high source impedance for at least certain frequency bands.

In certain embodiments, a communication may be issued based on the checking of the probe ground connection using any of the techniques described herein. For example, an alert may be issued responsive to a determination that a disconnect or other issue is or may be present within the probe ground connection. In certain embodiments where no such disconnect or other issue is detected within the probe ground connection, a notification may be issued to advise the user that the probe ground connection appears to be solid.

An alert or notification such as those described above may include a visual indication, e.g., the lighting of an LED or issuing of a text-based or other type of message, an audible indication, e.g., a buzzing sound or other noise suitable to be heard by a user, or any suitable combination thereof. Alternatively or in addition thereto, the alert or notification may be delivered to the user by way of the test measurement device itself, e.g., by way of an oscilloscope display.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

What is claimed is:

1. A test system, comprising:
    a probe suitable to be coupled between a test measurement device and a device under test (DUT), said probe comprising:
    a signal input configured to electrically receive an active signal from the DUT;
    a signal output configured to electrically provide the active signal to the test measurement device;
    an input ground configured to electrically connect to a ground of the DUT;
    an output ground configured to electrically connect to a ground of the test measurement device; and
    a probe ground connection checking device configured to automatically determine whether a suitable ground connection exists between said probe input ground and said DUT ground.

2. The test system of claim 1, wherein said test measurement device comprises an oscilloscope.

3. The test system of claim 1, wherein said probe ground connection checking device is configured to determine whether a sufficiently low impedance exists from said probe input ground through said DUT ground, an auxiliary ground connection from said DUT ground to said test measurement device ground, and back to said probe output ground.

4. The test system of claim 1, the test system further comprising a probe cable connected to the probe, and in which the probe ground connection checking device comprises:
    a magnetic core configured to receive the probe cable; and
    a test coil inductively coupled to the probe cable and configured to receive an alternating current.

5. The test system of claim 1, in which the probe ground connection checking device comprises a switching mechanism having an open position configured to prevent a flow of direct current through the output ground.

6. The test system of claim 5, in which the probe ground connection checking device further comprises an alternating current (AC) coupling across the switching mechanism.

7. The test system of claim 1, in which the probe ground connection checking device comprises a buffer amplifier and a voltage source, the voltage source being configured to drive a voltage of the input ground through the buffer amplifier.

* * * * *